United States Patent [19]

Harnden, Jr. et al.

[11] Patent Number: 4,742,263
[45] Date of Patent: May 3, 1988

[54] PIEZOELECTRIC SWITCH

[75] Inventors: John D. Harnden, Jr., Schenectady; William P. Kornrumpf, Albany; James E. Kohl; Michael S. Adler, both of Schenectady, all of N.Y.

[73] Assignee: Pacific Bell, San Francisco, Calif.

[21] Appl. No.: 88,827

[22] Filed: Aug. 24, 1987

Related U.S. Application Data

[62] Division of Ser. No. 896,792, Aug. 15, 1987, Pat. No. 4,697,118.

[51] Int. Cl.⁴ .............................................. H01L 41/08
[52] U.S. Cl. ................................. 310/331; 310/330; 310/367; 200/181
[58] Field of Search ............................. 310/330–332, 310/367, 316, 317; 200/181

[56] References Cited

U.S. PATENT DOCUMENTS

| | | | |
|---|---|---|---|
| 4,595,855 | 6/1986 | Farrall | 310/332 |
| 4,654,555 | 3/1987 | Ohba et al. | 310/332 |
| 4,697,118 | 9/1987 | Harnden, Jr. et al. | 310/331 |

FOREIGN PATENT DOCUMENTS

| | | | |
|---|---|---|---|
| 273157 | 7/1964 | Australia | 310/331 |
| 0060005 | 5/1977 | Japan | 310/332 |

Primary Examiner—Mark O. Budd
Attorney, Agent, or Firm—Fitch, Even, Tabin & Flannery

[57] ABSTRACT

A switch is provided wherein a piezoelectric bimorph element is used to provide many separately controllable, closely spaced switchable contacts. The element includes at least two oppositely extending fingers connected by a common spine. The element spine is mounted to a case with the fingers spaced from an inner case surface. Electronic circuit means are mounted on the element spine for applying a separate electrical potential to each of the element fingers. A separate movable electrical contact is disposed on each of the element fingers spaced from the spine and insulated from the means for applying the separate electrical potentials to the fingers. A separate stationary contact is provided on an inner case surface opposite each of the movable contacts. In operations, a separate electrical potential is applied to each of the element fingers for selectively causing each finger to deflect and force its movable contact into electrical connection with the opposing stationary contact.

5 Claims, 6 Drawing Sheets

PIEZOELECTRIC SWITCH

This is a division of application Ser. No.: 896,792, filed Aug. 15, 1986, now U.S. Pat. No. 4,697,118, issued Sept. 29, 1987.

This invention relates in general to switches and more specifically to a switch implemented with a piezoelectric bender.

BACKGROUND OF THE INVENTION

In the past, the switching of voltages has typically been accomplished through the use of electromechanical relays or solid state devices. Electromechanical relays present many disadvantages, including large size and weight, high power consumption, and lack of reliability. When used in a complex matrix switch, for example of the type used in a telephone switching system, the sheer size and complexity of such a system greatly exacerbates these disadvantages. Solid state switches, while much smaller in size and requiring less power than electromechanical switches, present the disadvantage of fragility to many types of real world, field operating conditions. This fragility gives complex switching systems implemented with solid state devices a potentially high failure rate and a subsequently low mean-time-between-failure, making them difficult and expensive to maintain.

It is known in the art to use piezoelectric benders to implement switches. However, in the art of matrix switches, any construction which provides a greater switching capacity in a smaller, simpler, more reliable or lower power package represents a substantial improvement. This is particularly true, for example, in telephone matrix switching systems of the type wherein many switchable contacts must be separately controlled to selectively interconnect multiple inputs with multiple outputs. It would thus be desirable to provide an improved switch for matrix applications which provides for the individual control of many switchable contacts in one small, light, and low power package. It would be further desirable to provide such a switch having isolation between switched signals in the megahertz frequency range, and which could be constructed in accordance with known manufacturing techniques.

OBJECTS OF THE INVENTION

Accordingly, it is a principle object of the present invention to provide a new and improved piezoelectric switch which provides for separate control of many switched contacts while being small in size, light in weight, and requiring very low levels of actuation power.

Another object of the present invention is to provide a new and improved bimorph piezoelectric element configuration which is particularly adaptable to matrix switching applications.

Yet another object of the present invention is to provide a piezoelectric switch which is reliable in operation.

A further object of the present invention is to provide a piezoelectric switch particularly adapted for use in modern telephone switching and communication systems.

Another object of the present invention is to provide a piezoelectric switch providing good isolation characteristics between switched signals in modern telephone and communications systems having signals in the range of up to 1 megahertz.

SUMMARY OF THE INVENTION

A new and improved switch is provided wherein a piezoelectric bimorph element is used to provide many separately controllable, closely spaced, switchable contacts. In accordance with the invention, the piezoelectric bimorph element, hereinafter referred to as the element, includes at least two generally coplanar and oppositely extending fingers connected by a common spine. Means are provided for mounting the spine of the element in a case, with the fingers spaced from an inner case surface. Further means are provided for applying a separate electrical potential to each of the fingers on the elements, whereby to separately control their deflection in a direction generally perpendicular to the plane of the fingers. At least one separate movable electrical contact is disposed on each of the element fingers, the contact being spaced from the spine and insulated from the means for applying the separate electrical potentials to the fingers. At least one separate stationary contact is provided on the inner case surface opposite each of the movable contacts. In operation, a separate electrical potential is applied to each of the element fingers for selectively causing each finger to deflect and force its movable contact into electrical connection with the opposing stationary contact.

In a preferred embodiment of the invention, the element includes more than two oppositely extending and coplanar fingers, all connected by an intermediately disposed, unpoled spine. The movable and stationary contacts can be varied in type, quantity and configuration to meet different operating requirements. The inventive piezoelectric matrix switch provided herein has particular application in telephone matrix switching environments which require many, separately controllable, switchable contacts in a small, low power package.

BRIEF DESCRIPTION OF THE DRAWINGS

While the specification concludes with claims defining the features of the invention that are regarded as novel, it is believed that the intention, together with further objects thereof, will be better understood from a consideration of the following description in conjunction with the drawing figures, in which:

FIG. 4 illustrates a sectional view of a second embodiment of the invention;

FIG. 5 illustrates a sectional view of a third embodiment of the invention;

DETAILED DESCRIPTION OF THE INVENTION

Figure 1:
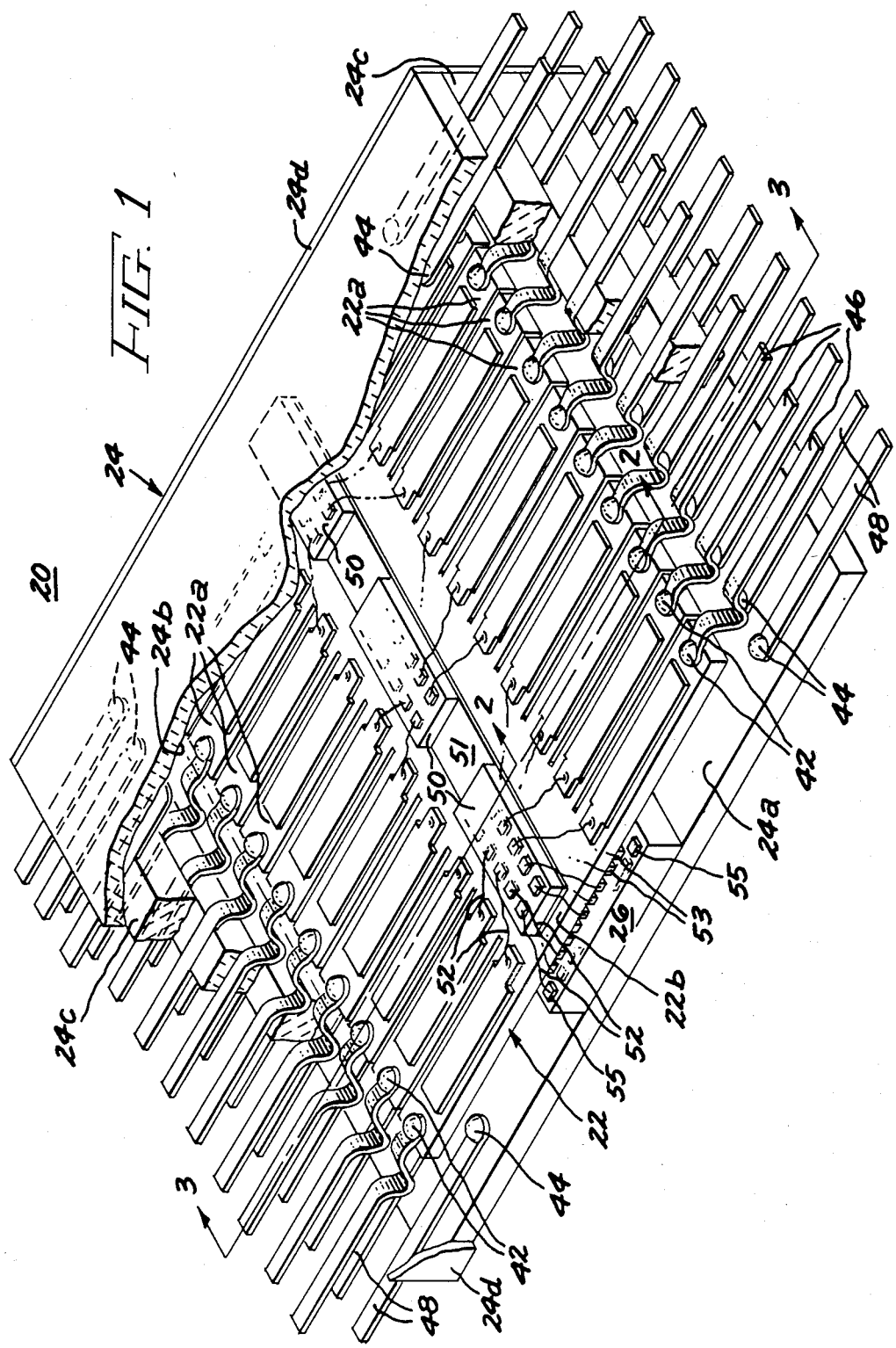
FIG. 1 illustrates a perspective view, partly cut away, of a matrix switch implemented in accordance with a first embodiment of the present invention.
Figure 2:
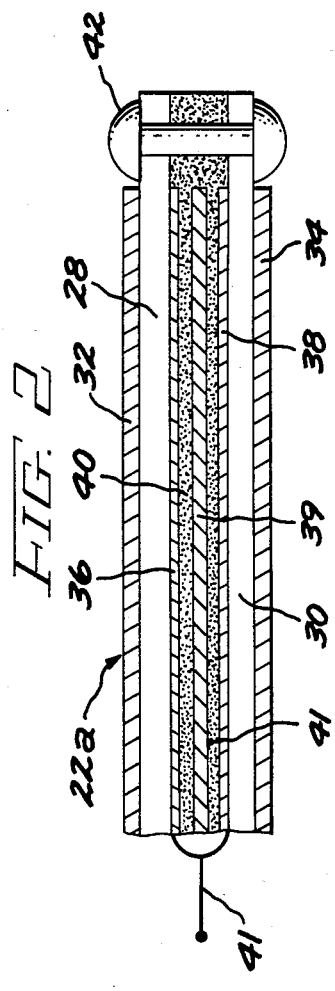
FIG. 2 illustrates a sectional view taken along line 2—2 of FIG. 1.
Figure 3:
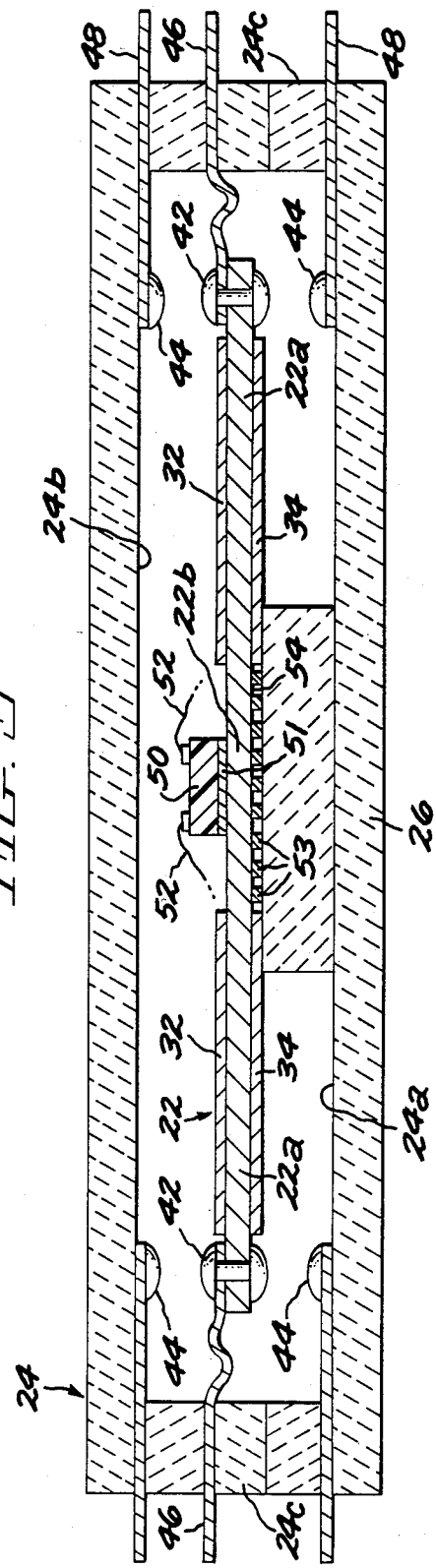
FIG. 3 illustrates a sectional view taken along line 3—3 of FIG. 1.

Referring now to FIGS. 1, 2 and 3, a switch 20 includes a unitary bimorph piezoelectric element 22 fastened to a case 24 via an anchor 26 mounted on a first inner surface 24a of the case. A second inner case surface 24b is disposed parallel to surface 24a, and spaced therefrom by sidewalls 24c and 24d, the former shown herein comprising multiple layers. Case 24 and anchor 26 are illustrated as comprising a ceramic material. However, depending on environmental and manufacturing constraints, case 24 and anchor 26 could alternatively comprise, for example, an engineering plastic such as ULTEM polyetherimide resin (ULTEM is a registered trademark of General Electric Co.). Element 22 includes a plurality of generally coplanar fingers 22a arranged in substantially coaxial, oppositely extending pairs connected by an intermediately disposed spine 22b. As shown in detail in FIG. 2, each finger 22a is separately controllable and includes parallel disposed upper and lower ceramic plate elements 28 and 30, respectively. Plate elements 28 and 30 are sandwiched between upper and lower metal layers 32 and 34, respectively, and in turn sandwich a pair of electrically connected metal layers 36 and 38 which are fastened to a metal spring layer 39 by intervening layers of epoxy 40 and 41, respectively. The electrical connection between metal layers 36 and 38 is shown schematically at 41 in FIG. 2. Separate metal layers 32 and 34 are disposed on each element finger 22a for separately poling the element fingers in a manner well known to those skilled in the art. Metal layers 36 and 38 and spring layer 39 are common to spine 22b and all fingers 22a of element 22. Metal layers 32 and 34 terminate short of spine 22b such that the spine remains unpoled during operation of switch 20.

Element 22 comprises conventional materials known to those skilled in the art, including the multi-layer, capacitor-like fabrication approach. Plates 28 and 30 comprise, for example, lead zirconate titanate, barium titanite, or other known piezoelectric ceramic materials. Metal layers 32, 34, 36 and 38 comprise, for example, nickel, silver or other conventional conductive materials. As will be appreciated by those skilled in the art, the use of electrically connected metal layers 36 and 38 sandwiched about spring layer 39 with epoxy layers 40 and 41 produces a bender element having substantial force and resilience. However, as will also be appreciated by those skilled in the art, this center sandwich can be replaced by a single conductive layer. To decrease the complexity of the drawings and more clearly illustrate the invention, the detailed cross-section of element 22 is shown only in FIG. 2, and the thickness of metal layers 32 and 34 has been exaggerated in all the Figures.

Each element finger 22a supports a separate movable contact 42 in the form of a stud extending through the free end of the finger opposite spine 22b, and spaced from metal layers 32, 34, 36 and 38, and spring layer 39. First and second separate stationary electrical contacts in the form of pads 44 are disposed on surfaces 24a and 24b of case 24 opposite each movable contact 42. Separate flexible conductors 46, for example comprising thin copper layers, extend through the sides 24c of case 24 and into electrical contact with each contact 42 for making external electrical connections thereto. Similarly, separate conductors 48, for example comprising copper leads plated on ceramic case 24, extend through sides 24c of the case and into electrical contact with each pad 44 for making external electrical connections thereto. Means for applying a separate electrical potential to each element finger 22a includes electronic circuit elements 50 mounted on the upper surface of spine 22b via an intermediately disposed layer of adhesive metallization 51, metal layer 51 being insulatingly spaced from metal layers 32. Circuit elements 50 comprise, for example, high voltage integrated circuit devices of the type comprising both low voltage logic and high voltage drive circuitry on a single chip. A separate metal lead 52 extends between each metal layer 32 and 34 on each finger 22a, and a corresponding connection on one of circuit elements 50, for making electrical connection therebetween. As is clear from a consideration of FIGS. 1 and 3, a plurality of metallized leads 53 extend between element 22 and anchor 26 for making electrical connection between circuit elements 50 and lower layers of metallization 34. Connection is made between leads 53 and circuit elements 50 via leads 52 at the edge of element 22. The gap 54 between element 22, anchor 26 and leads 53 is optionally filled with epoxy. Gap 54 is shown exaggerated in size due to the exaggerated thickness of metal layers 32 and 34. Pads 55 are provided on anchor 26 for making electrical connection between circuit elements 50 and external electrical control signals (not shown) via leads 52. Electrical connection is made between pads 55 and external circuits (not shown) by, for example, providing a conductive metal bore (not shown) extending between the pad and the bottom of case 22 through anchor 26 using semiconductor fabrication techniques well known to those skilled in the art. Conductors and electrodes in the signal control path, such as leads 52, 53, need not have low ohmic values. Because of the low current and high impedance nature of piezoelectric element 22, those signal control path conductors can comprise non-metals such as thick film conductor patterns.

In operation, circuit elements 50 are used to apply a common electrical potential to electrically connected metal layers 36 and 38, and a separate electrical potential to metal layers 32 and 34 of each finger 22a. Each separate element finger 22a operates independently as a bimorph piezoelectric bender, in a manner well known in the art, and is caused to deflect and force its movable contact 42 into electrical contact with the opposing stationary contact 44 on surface 24a or surface 24b, depending on the polarity of the voltages applied to metal layers 32, 34, 36 and 38. Subsequently, when selected movable contact 42 makes electrical contact with the selected opposing stationary contact 44, an electrical path is established between the corresponding conductors 46 and 48. When voltage is removed from both metal layers 34 and 36 of a finger 22, that finger returns to the neutral position shown in FIGS. 1 and 3. Because spine 22b is left unpoled, there is minimal flexing of element 22 proximate circuit elements 50 or anchor 26, thereby preventing separation between the element and the anchor or circuit elements and increasing the life and reliability of switch 20. While electronic circuit elements 50 have been depicted as chips, it is understood that the invention is not so limited, and discrete components can also be used.

Figures 4, 5:
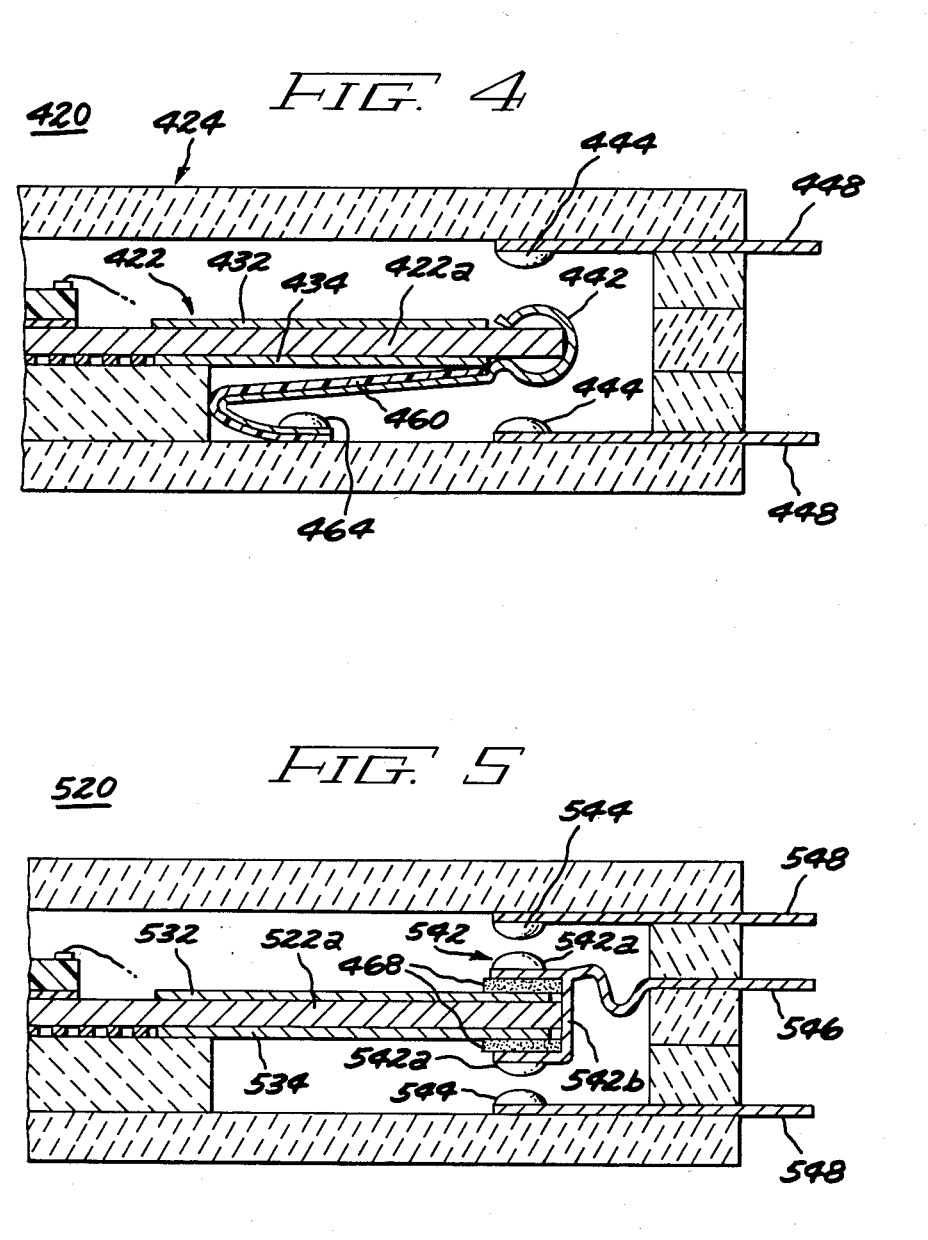

FIG. 4 shows a switch 420 substantially identical to switch 20 (FIGS. 1-3), with the exception of the construction of movable contact 442 and the electrical connections thereto. Like elements are indicated by like reference numerals incremented by 400. In this embodiment of the invention, each movable contact 422 comprises a metal clip of generally circular cross-section clipped onto the end of its corresponding element finger 422a and spaced from metal layers 432 and 434. A flexible printed circuit board 460 is disposed in case 424 and includes a separate electrical conductor for making electrical connection between each movable contact clip 422 and a corresponding, separate pad 464 or conductor (not shown). A separate connection (not shown) is subsequently made to each pad 464, for example using a conductor similar to 48 of FIGS. 1-3, for making external connections to pads 464.

Operation of switch 420 is identical to that described for switch 20 (FIGS. 1-3) above. The alternate construction of movable contacts 442 and the use of printed circuit board 460 permits the movable contacts to be fabricated independently from element 422 and easily assembled thereon during the subsequent assembly process.

FIG. 5 shows a switch 520 substantially identical to switch 20 (FIGS. 1-3), with the exception of the construction of a movable contact assembly 542. Like elements are indicated by like reference numerals incremented by 500. In this embodiment of the invention, each movable contact assembly 542 comprises a pair of contacts 542a spaced from metal layers 532 and 534, respectively, by intermediately disposed layers 468 of insulating material. These metal contacts are connected by an electrical conductor 542b wrapped around the tip of element finger 522a and spaced from metal layers 536 and 538 and the conductive center layers of finger 522a (not shown). Flexible electrical conductor 546 is disposed in contact with movable contact assembly 542 for making external electrical connection thereto.

The operation of switch 520 is substantially identical to that of matrix switch 20 (FIGS. 1-3). The use of insulating layers 468 underneath contact pads 524a permits metal layers 532 and 534 to extend substantially to the tip of element fingers 522a, providing the element fingers with a stronger deflection force. Further, the thickness of insulating layers 468 between the layers of metallization and the metal pads can be varied to subsequently adjust the spacing between movable contacts 542a and stationary contacts 544.

Figure 6:
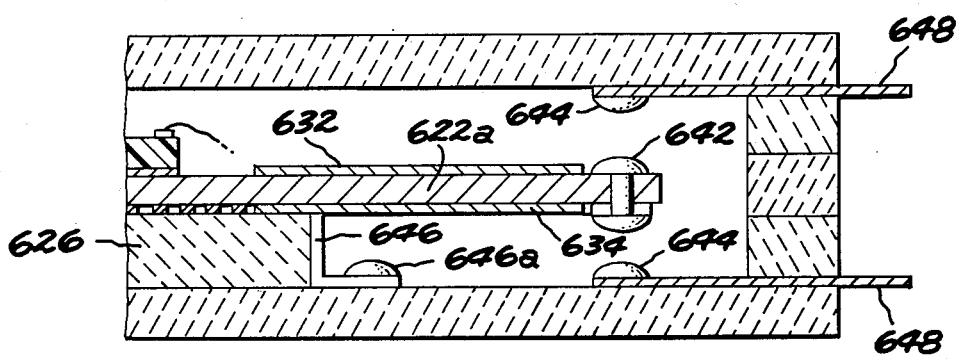
FIG. 6 illustrates a sectional view of a fourth embodiment of the invention.
Figure 6A:
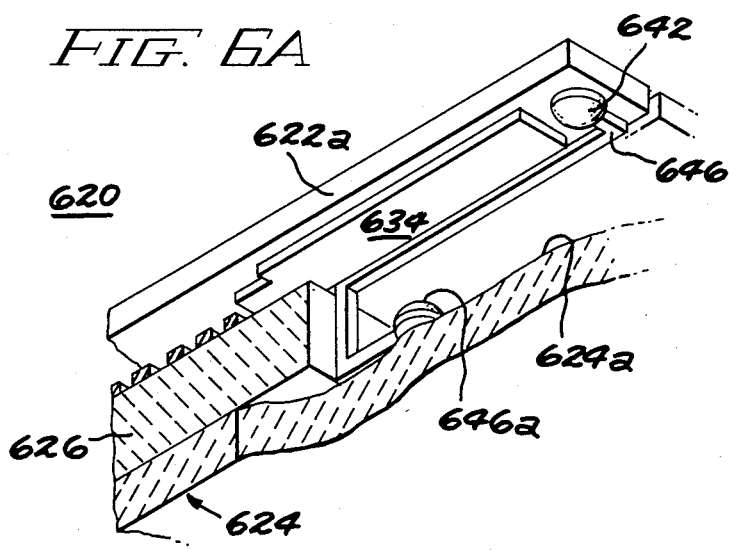
FIG. 6A illustrates a perspective view, shown from the underneath, of the fourth embodiment of the invention illustrated in FIG. 6.

FIGS. 6 and 6A illustrate a switch 620 substantially identical to switch 20 (FIGS. 1-3), with the exception of the construction of electrical conductors 646. Like features are indicated by like reference numerals incremented by 600. In this alternate embodiment of the invention, electrical conductors 646 are plated on element fingers 622a (spaced from the metal layers thereon), anchor 626 and case surface 624a. Each electrical conductor 646 terminates in a respective pad 646a disposed on surface 624a of case 624. Subsequent electrical connections(not shown), for example in the form of conductors 648, are made to pads 646a to accommodate external electrical connections. Operation of switch 620 is substantially identical to that of switch 20.

Figure 7:
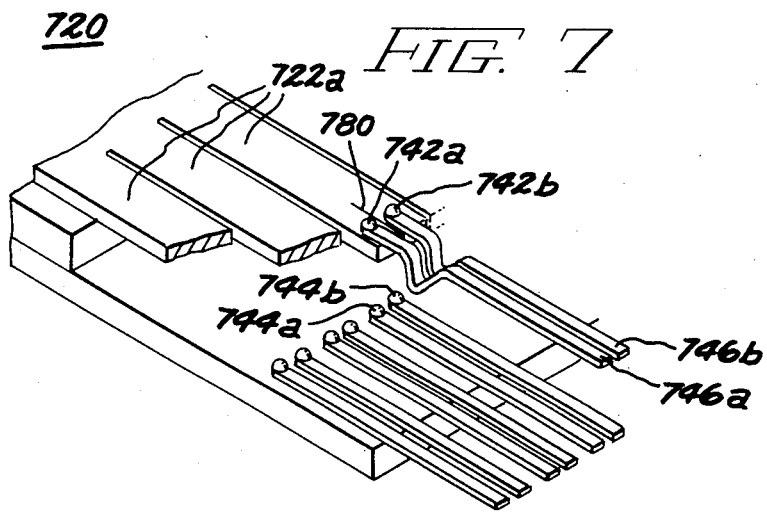
FIG. 7 illustrates a perspective view of a fifth embodiment of the invention.
Figure 7A:
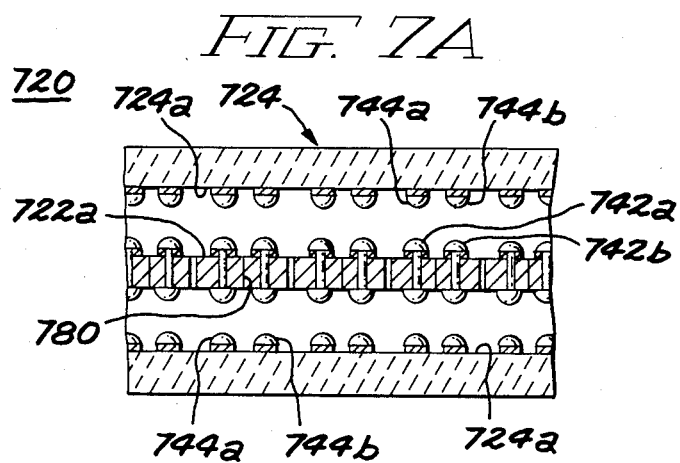
FIG. 7A illustrates a side, cross-sectional view of the embodiment of the invention illustrated in FIG. 7.

FIGS. 7 and 7A show a switch 720 substantially identical to switch 20 (FIGS. 1-3) with the exception of the construction of the movable and stationary contacts 742 and 744. Like features are indicated by like reference numerals incremented by 700. Various, previously described details of the matrix switch have been omitted from the drawing for the purpose of clearly illustrating the changed features. In this embodiment of the invention, each element finger 722a supports a pair of separate movable contacts 742a, 742b in the form of a pair of separate studs extending through the element finger. Each element finger 722a is shown with an optional bifurcation 780 proximate its tip extending vertically through the element finger between the movable contact pair. Further, a separate pair of stationary contacts 744a and 744b is disposed on each of case surfaces 724a and 724b, opposite each pair of movable contacts 742a and 742b, respectively.

The operation of switch 720 is substantially identical to that of switch 20 (FIGS. 1-3) with the exception that each element finger 722a switches two separate movable contacts 742a and 742b into selective contact with two separate pairs of stationary contacts 744a and 744b. Switch 720 thus makes available twice as many switchable connections as switch 20 of FIGS. 1-3. Bifurcating cuts 780 permit movable contacts 742a and 742b to vary slightly in their deflected distance and make good electrical contact with the respective, opposing stationary contact 744a, 744b. This bifurcated construction thus accommodates minor manufacturing deviations, for example in the relative thickness of the various contacts, which might otherwise interfere with the establishing of good mechanical and electrical connections.

Figure 8:
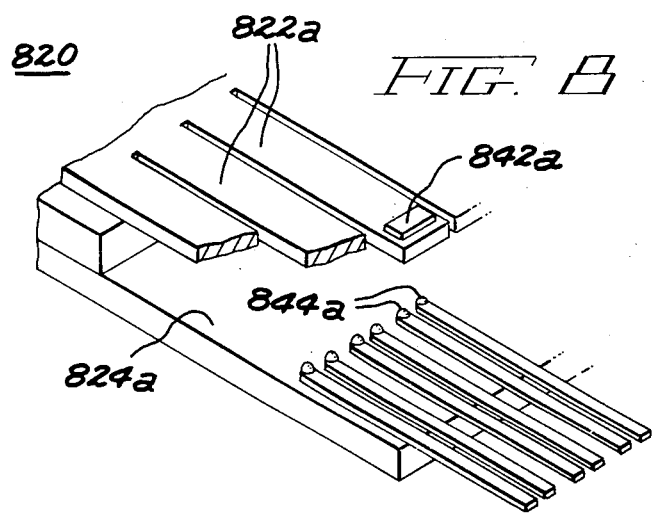
FIG. 8 illustrates a perspective view of a sixth embodiment of the invention.
Figure 8A:
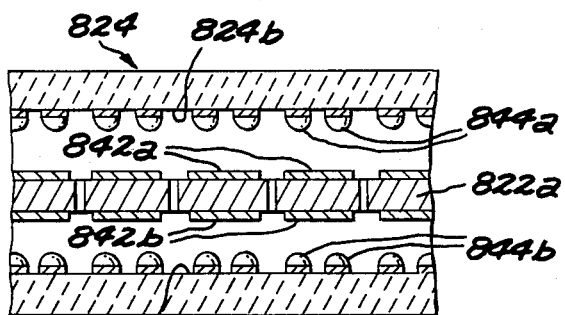
FIG. 8A illustrates a side, cross-sectional view of the embodiment of the invention illustrated in FIG. 8.

FIGS. 8 and 8A also show an alternate embodiment of switch 20 (FIGS. 1-3) wherein the drawings have been simplified to better illustrate the alternate construction of movable contacts 842a and 842b and stationary contacts 844a and 844b. Like features are indicated by like reference numerals incremented by 800. In this embodiment of the invention, each element finger 822a supports two separate, rectangularly shaped movable contacts 842a and 842b, one contact 842a being disposed on the top surface of each element finger, and one contact 842b being disposed on the bottom surface of each element finger (as viewed in FIGS. 8 and 8A). One pair of stationary contacts 844a is disposed on case surface 824b opposite each movable contact 842a. Similarly, one pair of stationary contacts 844b is disposed on case surface 824a opposite each movable contact 842b. It will be understood that in the embodiments of the invention shown in the simplified drawings for FIGS. 7 and 8, the movable contacts are spaced or insulated from the layers of metal on the element fingers as in the previous embodiments described hereinabove.

In operation, movable contacts 842a and 842b act to electrically bridge and thus short circuit the opposing pair of stationary contacts, thus establishing an electrical connection selectively between conductor pairs 844a or conductor pairs 844b.

Figure 8B:
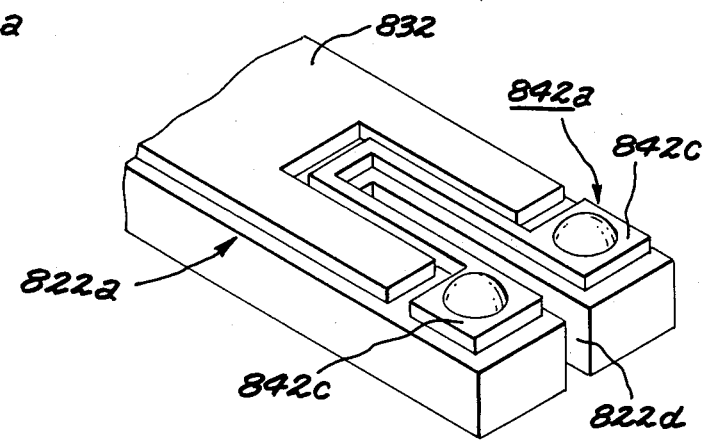
FIG. 8B illustrates a perspective view of an alternate embodiment of the element finger and contact construction shown in FIGS. 8 and 8A.

FIG. 8B shows an alternate embodiment of element finger 822a and movable contacts 842a and 842b, and is enlarged to better illustrate detail. In this embodiment of the invention, each finger 822a includes a vertically extending bifurcation 822d. Each movable contact comprises a generally U-shaped plate edging bifurcation 822d, spaced from the metal layers on the finger (only metal layer 832 being visible in FIG. 8), and terminating in two pads 842c at the tip of the finger, one pad on each side of the bifurcation. Metallization layers 832 and 834 (not visible in FIG. 8B) can optionally terminate short of bifurcation 822d, leaving the tip of element finger 822a, proximate the bifurcation, unpoled. The operation of this embodiment of the invention is substantially identical to that of FIGS. 8 and 8A above, with bifurcation 822d accommodating minor manufacturing deviations by permitting some flexibility proximate the free end of finger 822a in a manner similar to that described for FIGS. 7 and 7A above.

There is thus provided alternate embodiments of a switch, each of which uses a bimorph piezoelectric bender element in a compact, comb shaped configuration to provide separate control of multiple, closely spaced, switchable electrical contacts. The switch is light in weight, small in size, and can be constructed using known fabrication technologies. Precision semiconductor microcircuit fabrication techniques can be used to manufacture large quantities of these switches with reliable, repeatable, close-tolerance features. The nature of the switch provides a high degree of electrical isolation, and hence low cross-talk, between switched signals even at frequencies approaching the megahertz range. Further, each embodiment of the switch has a low actuator power requirement, and comprises sturdy, reliable components. As is shown in the multiple embodiments, the exact nature of the contact construction and hence the switching operations can be tailored to specific operational and/or manufacturing requirements. Further, the inclusion of electronic circuit elements on the piezoelectric element and within the case provides a substantially self-contained unit with the attendant advantages of ease of installation and serviceability in a compact package.

While a preferred embodiment of the invention has been illustrated and described, it will be clear that the invention is not so limited. For example, while the embodiments of the invention illustrated and described herein include multiple pairs of generally coaxial and oppositely extending fingers, it will be appreciated that the invention is not so limited. A switch constructed in accordance with the present invention could comprise, for example, a single element finger extending opposite of two or more fingers, or any other combination of oppositely extending fingers. Further, while the embodiments shown and described above each include at least two stationary contacts (i.e., one on a case upper surface and one on a case lower surface) opposite each movable contact, it will be appreciated by those skilled in the art that the invention is equally applicable to switches in which only one stationary contact opposes each movable contact (i.e., a single-pole, single-throw switch configuration). Numerous modifications, changes, variations, substitutions and equivalents will occur to those skilled in the art without departing from the spirit and scope of the present invention. Accordingly, it is intended that the invention herein be limited only by the scope of the appended claims.

What is claimed is:

1. A piezoelectric relay comprising:
    piezoelectric element mounted in a substantially cantilevered manner such that one end is fixed and the other is free to move in a predetermined direction in response to the application of an electric field to said piezoelectric element, said free end having mounted thereon first and second contact means, each of said contact means engaging a corresponding contact means spaced therefrom when said electric field is applied to said piezoelectric element, said piezoelectric element including means for allowing said first contact means to move relative to said second contact means, said allowing means comprising a bifurcation extending therethrough from said free end of said piezoelectric element a predetermined distance into said piezoelectric element, said bifurcation separating said first and second contact means.

2. The relay of claim in which said first and second contact means are electrically connected.

3. The relay of claim in which said piezoelectric element comprises:
    two separate layer of piezoelectric material sandwiching an intermediately disposed layer of metallization;
    a separate layer of metallization on a top surface of said element; and
    a separate layer of metallization on a bottom surface of said element.

4. A piezoelectric relay comprising;
    a piezoelectric element;
    means for supporting said piezoelectric element in a substantially cantilevered neutral position such that one end of said piezoelectric element is fixed and the opposite end of said piezoelectric element is free for displacement with respect to said fixed end, said piezoelectric element being responsive to the application of an electric field to move said free end of said piezoelectric element in a first direction with respect to said neutral position; and
    electrical contact means having a first portion coupled to said piezoelectric element adjacent to said free end and having a second portion spaced from said free end of said piezoelectric element, said first portion of said electrical contact means having a first pair of contact regions separated by a bifurcation, said second portion of said electrical contact means having a second pair of contact regions, said second contact region pair being positioned to electrically engage said first contact region pair upon application of said first electric field wherein said bifurcation provides for compliant engagement of said first and second contact region pairs when said electric field is applied to said bimorph element.

5. A piezoelectric relay comprising:
    a piezoelectric element;
    means for supporting said piezoelectric element in a substantially cantilevered neutral position such that one end of said piezoelectric element is fixed and the opposite end of said piezoelectric element is free for displacement with respect to said fixed end;
    said free end having a bifurcation therein, said piezoelectric element being responsive to the application of a first electric field to move said free end of said piezoelectric element in a first direction with respect to said neutral position; and
    a pair of contacts coupled to said free end of said piezoelectric element, said contact pair being disposed across from each other and also being on opposing sides of said bifurcation, wherein upon application of said first electric field said contact pair is positioned to compliantly electrically engage via said bifurcation a pair of contacts spaced from said free end of said piezoelectric element and upon application of said second electric field said contact pair is positioned to electrically disengage said spaced contact pair.

* * * * *

UNITED STATES PATENT AND TRADEMARK OFFICE
CERTIFICATE OF CORRECTION

PATENT NO. : 4,742,263

DATED : May 3, 1988

INVENTOR(S) : John D. Harnden, Jr., et al.

It is certified that error appears in the above-identified patent and that said Letters Patent is hereby corrected as shown below:

Column 8, line 8, after "claim" insert --1--.

Column 8, line 10, after "claim" insert --2--.

Column 8, line 12, delete "layer" and insert therefor --layers--.

Signed and Sealed this

Eighteenth Day of October, 1988

Attest:

DONALD J. QUIGG

*Attesting Officer*  *Commissioner of Patents and Trademarks*